United States Patent [19]
Andrews

[11] Patent Number: 6,029,254
[45] Date of Patent: *Feb. 22, 2000

[54] METHOD FOR SYNCHRONIZING RESERVED AREAS IN A REDUNDANT STORAGE ARRAY

[75] Inventor: Anthony D. Andrews, Boulder, Colo.

[73] Assignee: EMC Corporation, Hopkinton, Mass.

[*] Notice: This patent is subject to a terminal disclaimer.

[21] Appl. No.: 08/579,314

[22] Filed: Dec. 27, 1995

Related U.S. Application Data

[63] Continuation of application No. 08/404,941, Mar. 15, 1995, which is a continuation of application No. 07/818,039, Jan. 8, 1992.

[51] Int. Cl.$^7$ ............................. G01R 31/28; G06F 11/00
[52] U.S. Cl. ............................... 714/6; 714/11; 714/12; 714/770
[58] Field of Search ....................... 395/182.04, 182.03, 395/182.05, 182.06, 182.07, 182.09, 182.1, 183.18, 185.01; 371/10.2, 10.3, 40.4, 40.15, 21.1; 711/118, 165; 714/6, 7–9, 11, 12, 42, 54, 710, 711

[56] References Cited

U.S. PATENT DOCUMENTS

| | | | |
|---|---|---|---|
| 3,893,178 | 7/1975 | Sordello | 360/73.02 |
| 4,092,732 | 5/1978 | Ouchi | 395/182.03 |
| 4,467,421 | 8/1984 | White | 711/118 |
| 4,562,576 | 12/1985 | Ratcliffe | 395/185.02 |
| 4,667,326 | 5/1987 | Young et al. | 371/39.1 |
| 4,722,085 | 1/1988 | Flora et al. | 371/40.15 |
| 4,754,397 | 6/1988 | Varaiya et al. | 361/685 |
| 4,761,785 | 8/1988 | Clark et al. | 371/51.1 |
| 4,768,193 | 8/1988 | Takemae | 371/10.3 |
| 4,775,978 | 10/1988 | Hartness | 371/40.15 |
| 4,817,035 | 3/1989 | Timsit | 395/185.07 |
| 4,849,929 | 7/1989 | Timsit | 395/182.03 |
| 4,870,643 | 9/1989 | Bultman et al. | 395/182.05 |
| 4,899,342 | 2/1990 | Potter et al. | 395/182.04 |
| 4,914,656 | 4/1990 | Dunphy, Jr. et al. | 371/10.2 |
| 4,989,206 | 1/1991 | Dunphy, Jr. et al. | 395/182.05 |
| 4,993,030 | 2/1991 | Krakauer et al. | 395/182.05 |
| 5,088,081 | 2/1992 | Farr | 369/54 |
| 5,089,958 | 2/1992 | Horton | 395/182.03 |
| 5,109,505 | 4/1992 | Kihara | 395/182.03 |

(List continued on next page.)

FOREIGN PATENT DOCUMENTS

| | | |
|---|---|---|
| 0 303 856 | 7/1988 | European Pat. Off. . |
| 0 482 853 | 10/1991 | European Pat. Off. . |
| WO 8 402 409 | 6/1984 | WIPO . |
| WO 9 113 399 | 9/1991 | WIPO . |
| WO 9 113 405 | 9/1991 | WIPO . |

OTHER PUBLICATIONS

Patterson, D.A., Gibson, G., and Katz, H.; A Case For Redundant Arrays of Inexpensive Disks (RAID) (Jun. 1, 1988).

(List continued on next page.)

*Primary Examiner*—Dieu-Minh T. Le
*Attorney, Agent, or Firm*—William J. Kubida; Hogan & Hartson, LLP

[57] ABSTRACT

A redundant array storage system in which a reserved area of a multiplicity of data storage units can be reliably synchronized, even if the synchronization cycle is interrupted by an unforeseen event or situation, such as sudden loss of power to the system or a component failure. By maintaining two groups or partitions of data storage units and updating only one group at a time, and by having a global table which provides information regarding which group of storage units is being updated, the present invention allows the system to reliably determine which of the data storage units maintain valid data in their reserved area and to conform the reserved areas of the other group of data storage units to the valid values, without the use of additional hardware devices.

10 Claims, 4 Drawing Sheets

U.S. PATENT DOCUMENTS

| | | | |
|---|---|---|---|
| 5,124,987 | 6/1992 | Milligan | 395/182.05 |
| 5,130,992 | 7/1992 | Frey, Jr. et al. | 371/40.4 |
| 5,134,619 | 7/1992 | Hensen et al. | 371/40.15 |
| 5,138,710 | 8/1992 | Kruesi | 395/182.13 |
| 5,195,100 | 3/1993 | Katz | 395/182.2 |
| 5,210,866 | 5/1993 | Milligan | 395/182.04 |
| 5,222,217 | 6/1993 | Blount | 707/204 |
| 5,233,618 | 8/1993 | Glider | 395/182.04 |
| 5,239,637 | 8/1993 | Davis | 711/165 |
| 5,274,645 | 12/1993 | Idleman | 395/182.04 |
| 5,327,551 | 7/1994 | Kaneko | 395/182.03 |
| 5,475,697 | 12/1995 | Katz | 395/486 |

OTHER PUBLICATIONS

Lee, E.K.; Software and Performance Issues in the Implementation of a RAID Prototype (May 1990).

Chen, P., Gibson, G., Katz, R.H., Patterson, D.A., and Schulze, M.; Introduction to Redundant Arrays of Inexpensive Disks (RAID) (Dec. 1988).

Chen, P., Gibson, G., Katz, R.H., Patterson, D.A., and Schulze, M.; How Reliable is RAID? (Feb. 1989).

Chen, P., Gibson, G., Katz, R.H., Patterson, D.A., and Schulze, M., et al.; Evolution of the Raid 2 Architecture (Jun. 12, 1990).

Maximum Strategy, Inc., San Jose, CA; Strategy 2 Disk Array Controller Operation Manual (Nov. 2, 1988).

Maximum Strategy, Inc., San Jose, CA Strategy 1 Disk Array Controller Operation Manual (Date Unknown).

Gibson, G.A., Performance and Reliability in Redundant Arrays of Inexpensive Disks (Date Unknown).

Chen, P., An Evaluation of Redundant Arrays of Disks Using an Amdahl 5890; (1989).

Katz, R.H., Gibson, G.A. and Patterson, D.A.; Disk System Architectures for High Performance Computing (Mar. 1989).

Gray, J., Horst, B., and Walker, M.; Parity Striping and Disc Arrays: Low–Cost Reliable Storage with Acceptable Throughput (Jan. 1990).

Schultz, M.E.; Considerations in the Design of Raid Prototype (Aug. 1988).

Clark and Corrigan; IBM Systems Journal, vol. 28, No. 3, 1989.

METHOD FOR SYNCHRONIZING RESERVED AREAS IN A REDUNDANT STORAGE ARRAY

This is a continuation of application Ser. No. 08/404,941 filed Mar. 15, 1995, which is a continuation of Ser. No. 07/818,039 filed Jan. 18, 1992.

BACKGROUND OF THE INVENTION

1. Field of the Invention

This invention relates to computer system data storage, and more particularly to a system for synchronizing the information stored in the reserved area within each storage unit of a redundant array system.

2. Description of Related Art

A typical data processing system generally includes one or more storage units which are connected to a Central Processor Unit (CPU) either directly or through a control unit and a channel. The function of the storage units is to store data and programs which the CPU uses in performing particular data processing tasks.

Various types of storage units are used in current data processing systems. A typical system may include one or more large capacity tape units and/or disk drives (magnetic, optical, or semiconductor) connected to the system through respective control units for storing data.

In such systems, a problem exists if one of the large capacity storage units fails such that information contained in that unit is no longer available to the system. Often, such a failure will shut down the entire computer system.

The prior art has suggested several ways of solving the problem of providing reliable data storage. In systems where records are relatively small, it is possible to use error correcting codes which generate ECC syndrome bits that are appended to each data record within a storage unit. With such codes, it is possible to correct a small amount of data that may be read erroneously. However, such codes are generally not suitable for correcting or recreating long records which are in error, and provide no remedy at all if a complete storage unit fails. Therefore, a need exists for providing data reliability external to individual storage units.

A number of approaches to such "external" reliability have been described in the art. A research group at the University of California, Berkeley, in a paper entitled "A Case for Redundant Arrays of Inexpensive Disks (RAID)", Patterson, et al., *Proc. ACM SIGMOD*, June 1988, has catalogued five different approaches for providing such reliability when using disk drives as failure-independent storage units. Arrays of relatively low cost disk drives are characterized in one of five architectures, under the acronym "RAID" (for Redundant Arrays of Inexpensive Disks). FIG. 1 shows one such system in which a multiplicity of storage units 1 are connected to a controller 2 The controller 2 is coupled to a Central Processing Unit (CPU) 3 by standard bus 4.

In such systems, in which arrays of low cost storage units are provided as the means for storing large quantities of data with very high fault tolerance, it is common to allocate a number of sections of each storage unit as general data storage areas 5 for general use by the system, and to allocate one section of each storage unit as a "Reserved Area" (RA) 6. Each RA 6 is used to store items such as: system configuration information; primary software which can be recovered and loaded upon initiation of the system; secondary software which can be recovered and loaded at a time after initiation of the system; an "error log" in which an error history can be saved for use by diagnostic routines; temporary data for a host "scratch-pad", and diagnostic software routines which can be executed or loaded as needed by the system.

In FIG. 1, the RAs 6 within each data storage unit 1 are shown allocated as described above. In such systems, it is a common practice to replicate the Reserved Area information in corresponding blocks within all of the storage units of the array. (A "block" of data is that grouping of data which is typically managed as a unit when performing reading and writing operations and typically is the smallest addressable unit of data). The practice of replicating the Reserved Area information allows a failure of one or more of the individual storage units to have a minimal impact upon the operation of the system. Additionally, there is no need to determine which of the storage units currently maintains the Reserved Area information. However, since each storage unit is equally responsible for maintaining an RA 6, it is vital that the information in the RA 6 of every storage unit be exactly the same as the information in the RA 6 of every other storage unit. The process of maintaining the same information in each RA 6 is known in the art as "synchronizing" the data storage units. When the Reserved Area information stored in the various data storage units is not identical, the data storage units are said to be "unsynchronized." In an unsynchronized system it may be difficult or impossible to verify which RAs 6 contain valid information.

A common problem which faces such systems is how to perform a reserved area update process in a manner that can tolerate interruptions and prevent the system from becoming unsynchronized, and thereby prevent uncertainly as to which storage units contain valid RA reserved area information.

For example, if a power supply failure occurs while the RAs of a particular system are being synchronized in response to a change in the system configuration then the synchronization process will abort before it is complete. Upon return of power to the system, it may be impossible to reliably determine which of the storage units has valid data and which has old or otherwise unreliable data. Comparing the data in each of the RAs would indicate that a problem had occurred in the synchronization process, but would give no indication as to whether the problem occurred early in the process, in which case only a few of the storage units would be updated with the new RA data, or near completion of the process, in which case most of the data storage units would contain the new data and only a few would contain the old data. Additionally, some storage units might contain corrupt data due to the sudden loss of power to a storage unit during a Write sequence.

Because it is vital for many of the systems which employ failure-independent data storage arrays to rely upon the data stored in the RAs, it is desirable to provide a system that can very reliably synchronize all storage units during an update to the RAs. It is also desirable to provide a system that can determine the last state of the update process if a failure occurs, so that the update can be restarted without loss of data or uncertainty as to the validity of any data in the RAs. The present invention provides such a system.

SUMMARY OF THE INVENTION

The present invention is a redundant array storage system in which a multiplicity of data storage units can be reliably synchronized, even if the synchronization procedure is interrupted by an unforeseen event or situation, such as sudden loss of power to the system or a component failure.

In the present invention, the storage units comprising the storage unit array are divided into at least two groups. An "update table" is maintained in a "Reserved Area" (RA) in each of the storage units. Each update table is identical and preferably includes: (1) a block number field for identifying which block is currently being updated: (2) a flag field for identifying, by the use of a code which corresponds on a one-to-one basis to each logical data group, which logical data group of data storage units is being updated or, by a unique code, whether none of the data storage units is currently being updated; and (3) a "error checking" field which aids in determining the validity of the information in the update table.

Each synchronization cycle is performed on only one block of Reserved Area information, with one of the two groups of data storage units being completely updated before the update of the other group is begun. If the system is interrupted in the process of synchronizing the RAs, then the group which the flag field indicates was not being synchronized at the time of the interruption provides a reference from which reliable data can be attained. Because the synchronization process always proceeds in the same sequence (the same group of storage units is always updated first), it is possible to determine whether the synchronization process was interrupted before or after new data was Written to the RAs of the first group of data storage units.

By always maintaining and identifying a reliable reference group of storage units, the RAs of all of the storage units can be set to reliable values after an interruption of the synchronization process. Additionally, if an interruption to the synchronization procedure occurs, only one block in each of the storage units of the group need be verified or corrected, since the update table has a field which identifies the particular block being updated.

In this way, the present invention allows the system to reliably determine which group of data storage units maintains valid data in their RAs and to conform the RAs of the other group of data storage units to those values, without the use of additional hardware devices or excessive time and resource expenditures.

Further aspects of the present invention will become apparent from the following detailed description when considered in conjunction with the accompanying drawings. It should be understood, however, that the detailed description and the specific examples, while representing the preferred embodiment of the invention, are given by way of illustration only.

BRIEF DESCRIPTION OF THE DRAWINGS

Like reference numbers and designations in the drawings refer to like elements.

DETAILED DESCRIPTION OF THE INVENTION

Throughout this description, the preferred embodiment and examples should be considered as exemplars, rather than limitations on the method of the present invention.

Figure 1:
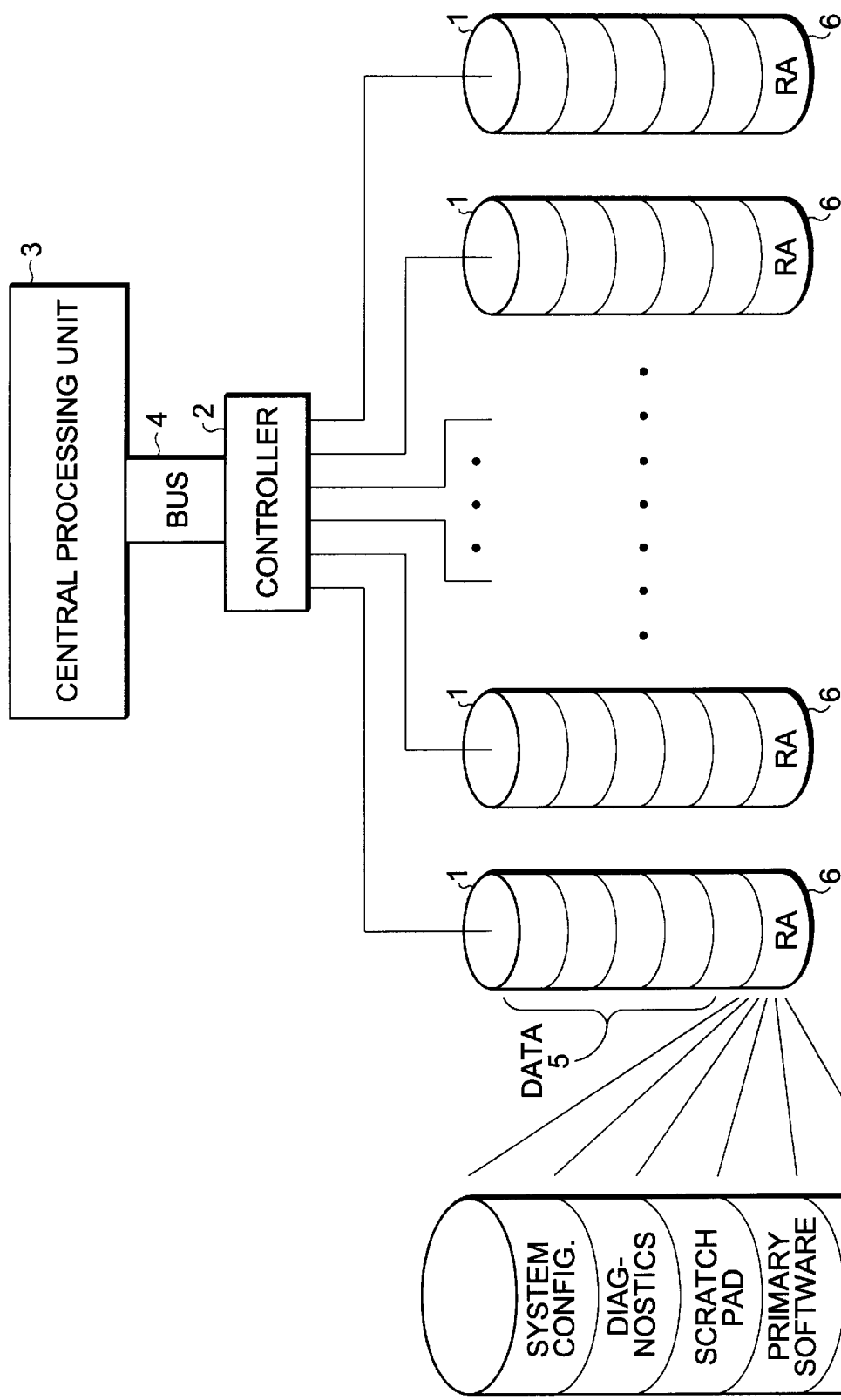
FIG. 1 is block diagram of a generalized prior art failure tolerant system in which redundant storage units provide the means for reliably storing data.
Figure 2:
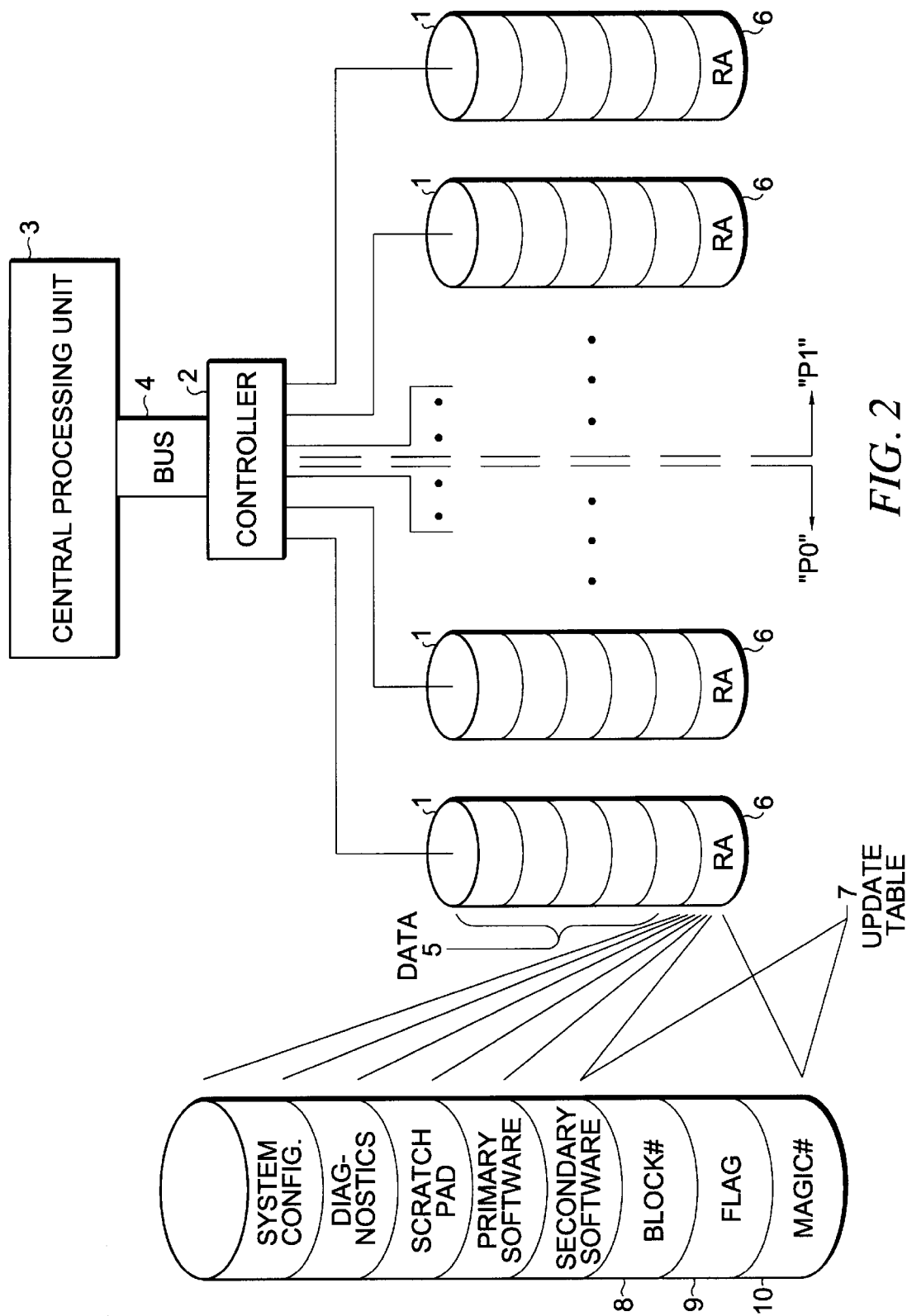
FIG. 2 is a block diagram of the preferred embodiment of the present invention.

FIG. 2 is a block diagram of a fault tolerant data storage system in which a multitude of data storage units 1 provide the means for reliably storing information. The storage area within each storage unit is divided into data areas 5 in which general data is stored, and a "Reserved Area" (RA) 6. Each RA 6 is further subdivided into blocks in which are stored system information, such as system configuration data, diagnostics, scratch pad, primary software, and secondary software. In addition, each RA 6 has a single block in which is stored an update table 7. In the present invention as shown in FIG. 2, a Central Processing Unit (CPU) 3 provides a means for controlling the transfer of data to a controller 2 across a bus 4, as is typical of data storage systems. The general data which is stored in the data storage units 1 is transmitted under the control of the controller 2. Additionally, the system information which is to be stored in the Reserved Areas typically is transmitted to the controller 2 from the CPU 3 on the bus 4, and then stored in the RA 6 of each of the data storage units 1.

A unique feature of the present invention is the division of the data storage units 1 into two logical groups, or partitions, P0 and P1. While the data storage units 1 may be dMded into more than two logical groups, in the preferred embodiment, only two logical groups are used.

Another unique feature of the present invention is the update table 7, which allows the device that controls the synchronization process to track the sequence of events being performed during synchronization. "Synchronization" is a procedure for ensuring that the Reserved Area data within each of the data storage units 1 is exactly the same as the Reserved Area data in each of the other data storage units.

The update table 7 of the preferred embodiment shown in FIG. 2 has at least three fields for implementing the inventive synchronization procedure. The first field is a "block number" field 8. In the preferred embodiment, only one block of data in each RA 6 can be changed in a single update cycle. The value stored in the block number field 8 indicates a set of corresponding blocks, one within the RA 6 of each data storage unit, that has been selected to be updated. The second field is a "flag" field 9, which indicates which logical group P0, P1 of data storage units 1 is currently being synchronized. When none of the logical groups are being synchronized, an IDLE code is set in the flag field. While more than two logical groups may be used, the preferred embodiment uses only two. When more than two logical groups are used, the flag field would indicate which of the plurality of groups, P0, P1, . . . Pn, is being synchronized. The third field in the update table 7 is a "error checking" field 10, in which an error correction code (such as a parity code, a cyclical redundancy checking code (CRC), or a Hamming code) is stored to aid in determining the integrity of the values in the update table. In this way, corruption of the values stored in the fields of the reserved areas may be detected.

Figure 3:
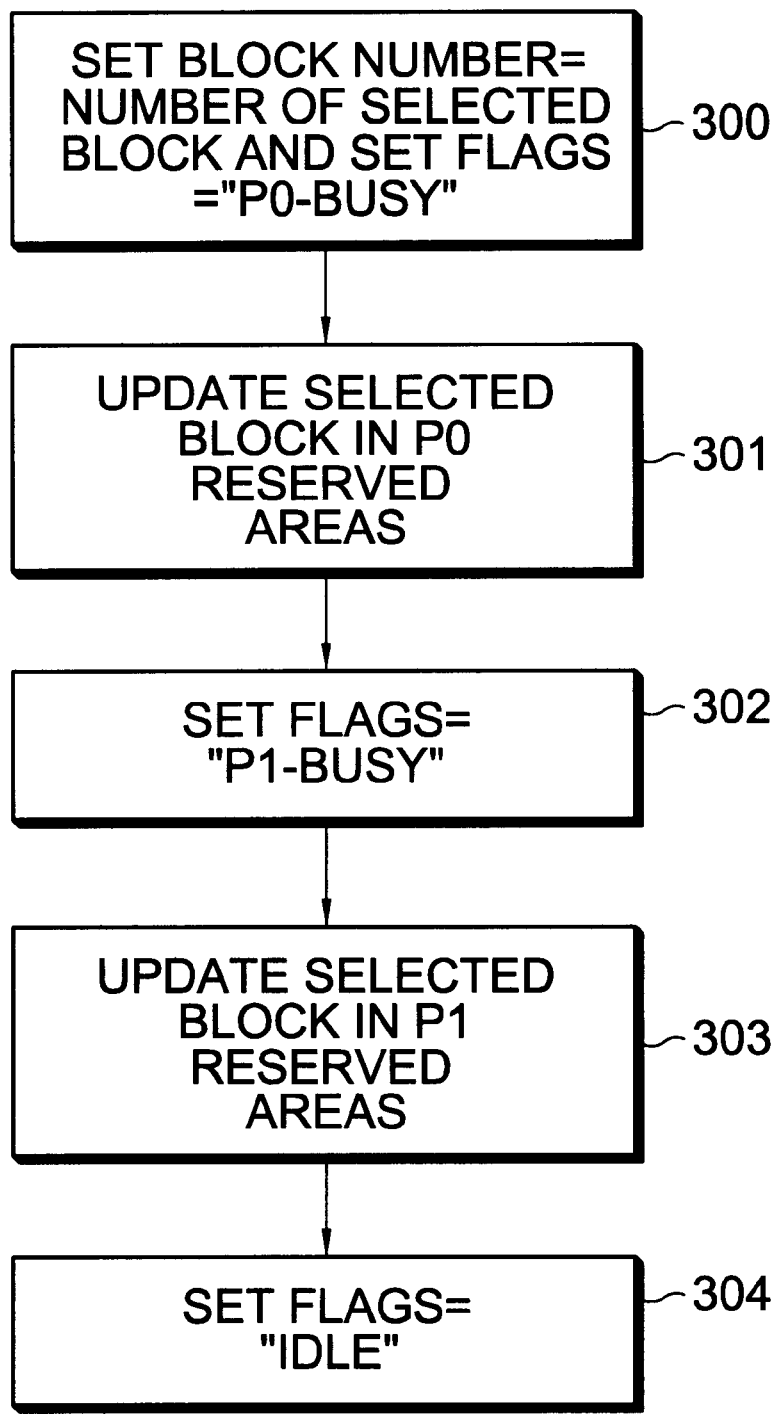
FIG. 3 is a flow chart of the inventive synchronization sequence.

FIG. 3 is a high level flow chart of the sequence of events which take place in the present invention during an RA synchronization cycle. A single synchronization cycle consists of STEPS 300–304. It should be noted that whenever a change is made to the value of one of the fields of the Reserved Area update table 7 of a data storage unit 1, all the corresponding fields in every data storage unit 1 in both logical groups P0, P1 must also be changed such that each update table 7 remains an exact replica of each other update table after such changes are completed.

As noted above, before a synchronization cycle starts, the flag field 9 of each update table 7 is set to "IDLE." Upon beginning synchronization of the data storage units 1, the block number field 8 in each update table 7 must be set to the number of the Reserved Area block selected to be updated. Also, the flag field 9 of each update table 7 must be set to "P0-BUSY" (STEP 300).

In the preferred embodiment, all of the update tables 7 are set simultaneously in a single write operation. Other embodiments are possible in which the block number field 8 and the flag field 9 of the update tables 7 of the P0 logical group are set first, and only after the all of the update tables of the P0 logical group are set are the block number 8 and flag field 9 of the update tables 7 of the P1 logical group set. Because in the preferred embodiment the block number field 8 a the flag field 9 within each update table are set together in an atomic write operation, if a system failure occurs while the block number field is being changed, the value of the block number fields 8 in those update tables 7 in which the value of the flag field 9 remains set to "IDLE" can serve as a reference indicating the value of the block number field 8 before the synchronization cycle had begun. Likewise, the value of the block number field 8 in those update tables 7 in which the flag field 9 is set to "P0-BUSY" can be used to identify the block which would have been updated had the interruption not occurred.

The flag field 9 indicates which of three phases the system is performing (updating the selected blocks in the P0 logical group, updating the selected blocks in the P1 logical group, or idle). Once each flag field 9 has been set to "P0-BUSY" and each block number field 8 has been set to the number corresponding to the Reserved Area block that is to be updated, the actual updating of the Reserved Area blocks in the P0 logical group that correspond to the value of the block number field 8 can begin (STEP 301). Updating of each block is performed in known fashion.

After each selected block in the P0 logical group is updated with the new information, the flag field 9 in the update table 7 of each data storage unit 1 in the system must be set to "P1-BUSY" (STEP 302). After each flag field 9 is set to P1-BUSY, the selected Reserved Area block in the RA 6 of each data storage unit 1 in the P1 logical group is updated (STEP 303). When this phase has been completed, the flag field 9 in each update table 7 is reset to "IDLE" (STEP 304), indicating satisfactory completion of a single synchronization cycle.

In the preferred embodiment, only one block of RA 6 data within each data storage unit 1 can be updated in a single synchronization cycle. This is because the block number field can only hold sufficient information to identify one block. For multiple blocks within each data storage unit to be updated, multiple synchronization cycles must be performed. The size of the block number field is restricted in the preferred embodiment to allow the update table 7 to fit within a single block in each RA 6. In an alternative embodiment, the block number can hold sufficient information to identify more than one block to be updated in a single cycle.

Since each update table 7 is limited to a single block in the preferred embodiment, an "atomic" Write procedure can be used to change each update table. As is known in the art, an atomic Write operation is a procedure whereby data is either positively written in its entirety, or the Write operation is positively aborted. Thus, it can be determined that the update table values in any one storage unit were not corrupted by a system failure during a write operation to the table.

Figure 4:
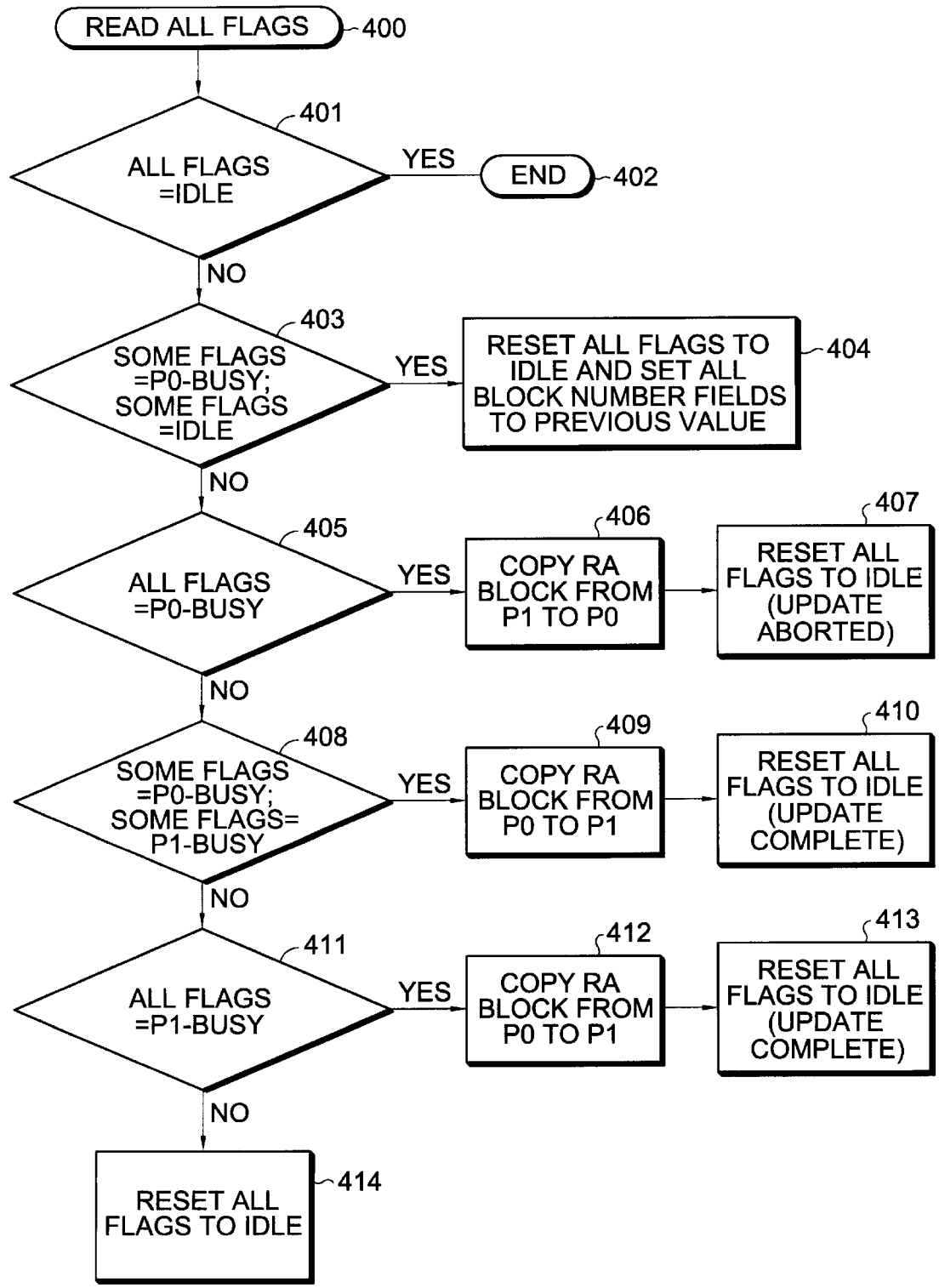
FIG. 4 is a flow chart which indicates the inventive process for recovering from a failure of the synchronization cycle.

FIG. 4 is a high level flow chart of the preferred recovery sequence followed by the invention when recovering from an interruption to a synchronization cycle due to a system failure during the cycle. The recovery process involves reading the flag field 9 of each data storage unit 1 to determine when the interruption occurred. Upon identifying when the interruption occurred, the recovery procedure takes the appropriate action to synchronize the RAs 6 of the data storage units 1 with reliable data Initially, all of the values of each flag field 9 of the update tables 7 in both logical groups of data storage units 1 must be read (STEP 400). After having read the values of all of the flag fields 9, the values of each are checked to determine whether they are all equal to "IDLE" (STEP 401). If the values of each and every flag field 9 in all the storage units are equal to "IDLE," then the interruption occurred either after the synchronization cycle was completed, or before the synchronization cycle had begun. This is due to the fact that the first step of the synchronization cycle is to change all of the flag fields 9 from "IDLE" to "P0-BUSY." All the flag fields 9 are not set to "IDLE" again until the synchronization cycle has been completed. Regardless of whether the cycle was interrupted before beginning or after completion, nothing further is required and the recovery procedure can end (STEP 402).

If all the values of each of the flag fields 9 are not equal to "IDLE," then a further inquiry is made to determine whether some of the flag fields 9 are equal to "P0-BUSY," and some are equal to "IDLE" (STEP 403). If this is the case, then the interruption to the synchronization cycle occurred while the number block fields 8 were being set to the value indicative of the block which was to be updated and the flag fields 9 were being set to "P0-BUSY" (STEP 300). No other changes had yet occurred to the RAs 6. Therefore, resetting all of the field flags 9 to "IDLE," and setting all the block number fields 8 of the storage units 1 in which the flag field 9 was not equal to "IDLE" to the value of the block number fields 8 of the storage units 1 in which the flag fields 9 were equal to "IDLE," will return the storage units to the state that they were in before the synchronization cycle was begun (STEP 404). Thus, the cycle that was interrupted is effectively aborted in a manner that ensures that the storage units are synchronized. The flag fields 9 and block number fields 8 are reset and set respectively in known fashion.

If the answer to the inquiry of STEP 403 was "No", then the next inquiry is whether all of the flag fields 9 are equal to "P0-BUSY" (STEP 405). If the values all of the field flags 9 are equal to "P0-BUSY," then the interruption occurred during the update of the Reserved Area blocks of the P0 logical group (STEP 301). In this case, the old Reserved Area data from the Reserved Area blocks in the P1 group designated by the value of the block number field 8 is copied into the corresponding Reserved Area blocks of the P0 group (STEP 406). By copying the data from the Reserved Area blocks of the P1 group to the Reserved Area blocks of the P0 group, any of the selected blocks in the P0 group which were changed during the interrupted synchronization cycle are returned to the value that existed before the cycle was commenced. Additionally, the flag fields 9 are reset to "IDLE" (STEP 407). In this way, the synchronization cycle is effectively aborted and the contents of the RAs 6 (including the update tables 7) of all the storage units 1 are synchronized to the state existing just prior to the interrupted synchronization cycle.

If the answer to the inquiry of STEP 405 is "No", then a further inquiry is made to determine whether some of the flag field values are equal to "P0-BUSY" and some are equal to "P1-BUSY" (STEP 408). If, in fact, the values of some flag fields 9 are equal to "P0-BUSY" and the values of others flag fields 9 are equal to "P1-BUSY," then the interruption to the synchronization cycle occurred during the update of the flag fields 9 to "P1-BUSY" (STEP 302). If this is the case, the Reserved Area blocks of the P0 logical group were properly updated. Hence, the Reserved Area data in the Reserved Area blocks of the P0 logical group indicated by the block number fields 8 is copied into the corresponding Reserved Area blocks of the P1 logical group. Because the RAs 6 of the P0 logical group were updated before the interruption, copying this data into the corresponding Reserved Area blocks of P1 logical group and resetting all the flag fields 9 in the update tables 7 to "IDLE" (STEP 410) will complete the synchronization cycle which was interrupted.

If, however, the answer to the inquiry of STEP 408 is "No," then a further inquiry will be required to determine when the interruption to the synchronization cycle occurred. In STEP 411, a determination is made as to whether all the flag fields 9 are equal to "P1-BUSY." If all of the flag fields 9 are equal to "P1-BUSY," then the interruption occurred during the update of the RAs 6 in the P1 group (STEP 303). Therefore, the Reserved Area blocks of the P0 logical group were property updated. Therefore, copying the data from the Reserved Area blocks of the P0 logical group indicated by the value of the block number fields 8 into the corresponding Reserved Area blocks of the P1 logical group (STEP 412) and resetting all the flag fields to "IDLE" (STEP 413) will complete the synchronization cycle.

If the answer to the inquiry of STEP 411 is "NO," then it must be that some 10 of the flag fields 9 are equal to "P1-BUSY" and others are equal to "IDLE" (although an explicit test could be made for this combination). Therefore, the interruption occurred during the final phase of the synchronization cycle in which all the flag fields 9 are reset to "IDLE" (STEP 304). By resetting all the flag fields 9 to "IDLE" (STEP 414), the synchronization cycle can be completed.

It will be understood that various modifications may be made without departing from the spirit and scope of the invention. For example, while the above described embodiment of the present invention is illustrated as being used in a system in which only two logical groups of data storage units are defined, this is for ease of understanding only and the present invention may also be used in a system in which three or more logical groups of data storage units are defined. Each logical group of data storage units may include any number of data storage units. However, due to efficiency considerations, it is recommended that two logical groups of equal numbers of data storage units be used. A further variation on the embodiment described is the use of a plurality of block number fields, which allows more than one Reserved Area block number to be selected, thereby allowing more than a single block to be updated in each synchronization cycle. As another example, although the tests described in FIG. 4 are set forth in a particular order, it will be recognized by one of ordinary skill in the art that the tests could be made in any order.

Accordingly, it is to be understood that the invention is not to be limited by the specific illustrated embodiment, but only by the scope of the appended claims.

I claim:

1. A redundant storage array system comprising:
   a. a plurality of failure-independent data storage units divided into at least two logical groups, at least some data storage units in each logical group including a reserved area for storing at least system information, and including an update table for storing at least a first value for indicating an interruption in a process for updating and synchronizing the reserved areas of the data storage units of the logical groups;
   b. a first controller for completely updating the reserved areas in a current logical group before any updating may commence on the reserved areas within a next logical group to ensure that the reserved areas of at least one logical group may be used as a reference to update and synchronize the reserved areas in data storage units of another logical group; and
   c. a processor for allowing recovery from, and synchronization to be reestablished after, an interruption to an update cycle, the processor including a second controller for;
      (1) storing a block number value in each update table identifying a block of data which is to be updated;
      (2) storing a flag value in each update table indicating that the first logical group of data storage units is to be updated;
      (3) updating in the first logical group of data storage units the block of data identified by the block number value in each update table;
      (4) storing a flag field value in each update table indicating that the update of the block of data in the first logical group of data storage units is complete and that the second logical group of data storage units is to be updated;
      (5) updating in the second logical group of data storage units the block of data identified by the block number value in each update table; and
      (6) storing a flag value in each update table indicating that the update of the block of data in the second logical group of data storage units is complete.

2. A redundant storage array system comprising:
   a. a plurality of failure-independent data storage units divided into at least two logical groups, at least some data storage units in each logical group including a reserved area for storing at least system information, and including an update table for storing at least a first value for indicating an interruption in a process for updating and synchronizing the reserved areas of the data storage units of the logical groups; and
   b. a first controller for completely updating the reserved areas in a current logical group before any updating may commence on the reserved areas within a next logical group to ensure that the reserved areas of at least one logical group may be used as a reference to update and synchronize the reserved areas in data storage units of another logical group,
      wherein; the update table further includes a flag field for identifying whether data stored in a reserved area was in the process of being updated by storing one of a set of codes, each code corresponding, one to one, with each logical group of data storage units, or by storing an IDLE code for identifying when none of the groups of data storage units are being updated, and the system further includes:
   c. a processor for preventing interruptions in a reserved area update process from causing the data storage units to become unsynchronized, including a second controller for
      (1) reading the each flag field value;
      (2) determining if all of the flag values equal the IDLE code;
      (3) determining if some of the flag values equal the IDLE code, and some equal P0-BUSY;

(4) determining if all of the flag values equal P1-BUSY;
(5) determining if some of the flag values equal P0-BUSY, and some equal P1-BUSY;
(6) determining if all of the flag values equal P1-BUSY; and
(7) resetting all flag fields to IDLE.

3. A redundant storage array system comprising:
a. a plurality of failure-independent data storage units divided into at least two logical groups, at least some data storage units in each logical group including a reserved area for storing at least system information, and including an update table for storing at least a first value for indicating an interruption in a process for updating and synchronizing the reserved areas of the data storage units of the logical groups; and
b. a first controller for completely updating the reserved areas in a current logical group before any updating may commence on the reserved areas within a next logical group to ensure that the reserved areas of at least one logical group may be used as a reference to update and synchronize the reserved areas in data storage units of another logical group,
wherein the update table further includes a flag field for identifying whether data stored in a reserved area was in the process of being updated by storing one of a set of codes, each code corresponding, one to one, with each logical group of data storage units, or by storing an IDLE code for identifying when none of the groups of data storage units are being updated, and the system further includes:
c. a processor for preventing interruptions in a reserved area update process from causing the data storage units to become unsynchronized, including a second controller for;
(1) reading the codes from each flag field;
(2) determining if all flag values are set to P0-BUSY;
(3) copying the information stored in the reserved area of one group of the data storage units into the reserved area of another group of data storage units; and
(4) resetting all flag fields to IDLE.

4. A redundant storage array system comprising:
a. a plurality of failure-independent data storage units divided into at least two logical groups, at least some data storage units in each logical group including a reserved area for storing at least system information, and including an update table for storing at least a first value for indicating an interruption in a process for updating and synchronizing the reserved areas of the data storage units of the logical groups; and
b. a first controller for completely updating the reserved areas in a current logical group before any updating may commence on the reserved areas within a next logical group to ensure that the reserved areas of at least one logical group may be used as a reference to update and synchronize the reserved areas in data storage units of another logical group,
wherein the update table further includes a flag field for identifying whether data stored in a reserved area was in the process of being updated by storing one of a set of codes, each code corresponding, one to one, with each logical group of data storage units, or by storing an IDLE code for identifying when none of the groups of data storage units are being updated, and the system further includes:
c. a processor for preventing interruptions in a reserved area update process from causing the data storage units to become unsynchronized, including a second controller for;
(1) reading the codes from each flag field;
(2) determining if some flag values are equal to P0-BUSY, and some are equal to P1-BUSY;
(3) copying the information stored in the reserved area of one group of the data storage units into the reserved area of another group of data storage units; and
(4) resetting all flag fields to IDLE.

5. A redundant storage array system comprising:
a. a plurality of failure-independent data storage units divided into at least two logical groups, at least some data storage units in each logical group including a reserved area for storing at least system information, and including an update table for storing at least a first value for indicating an interruption in a process for updating and synchronizing the reserved areas of the data storage units of the logical groups;
b. a first controller for completely updating the reserved areas in a current logical group before any updating may commence on the reserved areas within a next logical group to ensure that the reserved areas of at least one logical group may be used as a reference to update and synchronize the reserved areas in data storage units of another logical group;
wherein the update table further includes a flag field for identifying whether data stored in a reserved area was in the process of being updated by storing one of a set of codes, each code corresponding, one to one, with each logical group of data storage units, or by storing an IDLE code for identifying when none of the groups of data storage units are being updated, and the system further includes:
c. a processor for preventing interruptions in a reserved area update process from causing the data storage units to become unsynchronized, including a second controller for;
(1) reading the codes from each flag field;
(2) determining all the flag values are equal to P1-BUSY;
(3) copying the information stored in the reserved area of one group of the data storage units into the reserved area of another group of data storage units; and
(4) resetting all flag fields to IDLE.

6. A redundant storage array system comprising:
a. a plurality of failure-independent data storage units divided into at least two logical groups, each data storage unit including a reserved area for storage of at least system information, including system configuration information, the reserved area of each data storage unit further including an update table means for storing at least a first value for indicating an interruption in a process for updating and synchronizing the reserved areas of the data storage units of the at least two logical groups;
b. a controller for completely and concurrently updating all of the reserved areas in a current logical group before any updating may commence on the reserved areas within a next logical group to ensure that the reserved areas within the data storage units of at least one logical group of data storage units may be used as a reference to determine the state of the reserved areas in data storage units within each other logical unit; and
c. a processor for allowing recovery from, and synchronization to be reestablished after, an interruption to an update cycle, the processor including control means for;

(1) storing a block number value in each update table identifying a block of data which is to be updated;

(2) storing a flag value in each update table indicating that the first logical group of data storage units is to be updated;

(3) updating in the first logical group of data storage units the block of data identified by the block number value in each update table;

(4) storing a flag field value in each update table indicating that the update of the block of data in the first logical group of data storage units is complete and that the second logical group of data storage units is to be updated;

(5) updating in the second logical group of data storage units the block of data identified by the block number value in each update table; and (6) storing a flag value in each update table indicating that the update of the block of data in the second logical group of data storage units is complete.

7. A redundant storage array system comprising:

a. a plurality of failure-independent data storage units divided into at least two logical groups, each data storage unit including a reserved area for storage of at least system information, including system configuration information, the reserved area of each data storage unit further including an update table means for storing at least a first value for indicating an interruption in a process for updating and synchronizing the reserved areas of the data storage units of the at least two logical groups;

b. a controller for completely and concurrently updating all of the reserved areas in a current logical group before any updating may commence on the reserved areas within a next logical group to ensure that the reserved areas within the data storage units of at least one logical group of data storage units may be used as a reference to determine the state of the reserved areas in data storage units within each other logical unit, wherein the update table further includes a flag field for identifying whether data stored in a reserved area was in the process of being updated by storing one of a set of codes, each code corresponding, one to one, with each logical group of data storage units, or by storing an IDLE code for identifying when none of the groups of data storage units are being updated, and the system further includes:

c. a processor for preventing interruption in a reserved area update process from causing the data storage units to become unsynchronized, including control means for;

(1) reading the each flag field value;

(2) determining if all of the flag values equal the IDLE code;

(3) determining if some of the flag values equal the IDLE code, and some equal P0-BUSY;

(4) determining if all of the flag values equal P1-BUSY;

(5) determining if some of the flag values equal P0-BUSY, and some equal P1-BUSY;

(6) determining if all of the flag values equal P1-BUSY; and (7) resetting all flag fields to IDLE.

8. A redundant storage array system comprising:

a. a plurality of failure-independent data storage units divided into at least two logical groups, each data storage unit including a reserved area for storage of at least system information, including system configuration information, the reserved area of each data storage unit further including an update table means for storing at least a first value for indicating an interruption in a process for updating and synchronizing the reserved areas of the data storage units of the at least two logical groups; and b. a controller for completely and concurrently updating all of the reserved areas in a current logical group before any updating may commence on the reserved areas within a next logical group to ensure that the reserved areas within the data storage units of at least one logical group of data storage units may be used as a reference to determine the state of the reserved areas in data storage units within each other logical unit, wherein the update table further includes a flag field for identifying whether data stored in a reserved area was in the process of being updated by storing one of a set of codes, each code corresponding, one to one, with each logical group of data storage units, or by storing an IDLE code for identifying when none of the groups of data storage units are being updated, and the system further includes:

c. a processor for preventing interruptions in a reserved area update process from causing the data storage units to become unsynchronized, including control means for;

(1) reading the codes from each flag field;

(2) determining if all flag values are set to P0-BUSY;

(3) copying the information stored in the reserved area of one group of the data storage units into the reserved area of another group of data storage units; and (4) resetting all flag fields to IDLE.

9. A redundant storage array system comprising:

a. a plurality of failure-independent data storage units divided into at least two logical groups, each data storage unit including a reserved area for storage of at least system information, including system configuration information, the reserved area of each data storage unit further including an update table means for storing at least a first value for indicating an interruption in a process for updating and synchronizing the reserved areas of the data storage units of the at least two logical groups;

b. a controller for completely and concurrently updating all of the reserved areas in a current logical group before any updating may commence on the reserved areas within a next logical group to ensure that the reserved areas within the data storage units of at least one logical group of data storage units may be used as a reference to determine the state of the reserved areas in data storage units within each other logical unit wherein the update table further includes a flag field for identifying whether data stored in a reserved area was in the process of being updated by storing one of a set of codes, each code corresponding, one to one, with each logical group of data storage units, or by storing an IDLE code for identifying when none of the groups of data storage units are being updated, and the system further includes:

c. a processor for preventing interruptions in a reserved area update process from causing the data storage units to become unsynchronized, including control means for;

(1) reading the codes from each flag field;

(2) determining if some flag values are equal to P0-BUSY, and some are equal to P1-BUSY;

(3) copying the information stored in the reserved area of one group of the data storage units into the reserved area of another group of data storage units; and (4) resetting all flag fields to IDLE.

10. A redundant storage array system comprising:

a. a plurality of failure-independent data storage units divided into at least two logical groups, each data storage unit including a reserved area for storage of at least system information, including system configuration information, the reserved area of each data storage unit further including an update table means for storing at least a first value for indicating an interruption in a process for updating and synchronizing the reserved areas of the data storage units of the at least two logical groups; and b. a controller for completely and concurrently updating all of the reserved areas in a current logical group before any updating may commence on the reserved areas within a next logical group to ensure that the reserved areas within the data storage units of at least one logical group of data storage units may be used as a reference to determine the state of the reserved areas in data storage units within each other logical unit wherein the update table further includes a flag field for identifying whether data stored in a reserved area was in the process of being updated by storing one of a set of codes, each code corresponding, one to one, with each logical group of data storage units, or by storing an IDLE code for identifying when none of the groups of data storage units are being updated, and the system further includes:

c. a processor for preventing interruptions in a reserved area update process from causing the data storage units to become unsynchronized, including control means for:

(1) reading the codes from each flag field;

(2) determining all the flag values are equal to P1-BUSY;

(3) copying the information stored in the reserved area of one group of the data storage units into the reserved area of another group of data storage units; and (4) resetting all flag fields to IDLE.

* * * * *